(12) United States Patent
Yeom et al.

(10) Patent No.: US 9,245,752 B2
(45) Date of Patent: Jan. 26, 2016

(54) METHOD FOR ETCHING ATOMIC LAYER OF GRAPHENE

(71) Applicant: RESEARCH & BUSINESS FOUNDATION SUNGKYUNKWAN UNIVERSITY, Suwon-si (KR)

(72) Inventors: Geun Young Yeom, Seoul (KR); Woong Sun Lim, Suwon-si (KR); Kyung Seok Min, Suwon-si (KR); Yi Yeon Kim, Taean-gun (KR); Jong Sik Oh, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 14/161,050

(22) Filed: Jan. 22, 2014

(65) Prior Publication Data

US 2014/0206192 A1    Jul. 24, 2014

Related U.S. Application Data

(63) Continuation of application No. PCT/KR2012/005747, filed on Jul. 19, 2012.

(30) Foreign Application Priority Data

Jul. 22, 2011  (KR) .................. 10-2011-0072843
Jul. 9, 2012   (KR) .................. 10-2012-0074309

(51) Int. Cl.
*H01L 21/302*    (2006.01)
*H01L 21/04*     (2006.01)
*H01L 29/66*     (2006.01)
*H01L 29/16*     (2006.01)

(52) U.S. Cl.
CPC .......... *H01L 21/042* (2013.01); *H01L 21/0405* (2013.01); *H01L 29/1606* (2013.01); *H01L 29/66037* (2013.01)

(58) Field of Classification Search
CPC .............. H01L 21/042; H01L 21/1606; H01L 21/0405; H01L 21/31127
USPC ............................. 438/692–694; 216/37, 67
See application file for complete search history.

(56) References Cited

U.S. PATENT DOCUMENTS

| | | | |
|---|---|---|---|
| 8,709,953 B2 * | 4/2014 | Lill et al. ...................... | 438/715 |
| 2011/0033688 A1 | 2/2011 | Veerasamy | |
| 2013/0217215 A1 * | 8/2013 | Ward et al. .................... | 438/507 |

FOREIGN PATENT DOCUMENTS

KR    10-2010-0130695 A    12/2010
KR    10-2012-0048241 A     5/2012

OTHER PUBLICATIONS

Rong Yang et al. Advanced Materials, vol. 22, (2010) pp. 4014-4019.*

(Continued)

*Primary Examiner* — Duy Deo
*Assistant Examiner* — Maki Angadi
(74) *Attorney, Agent, or Firm* — NSIP Law

(57) ABSTRACT

This present disclosure relates to an atomic layer etching method for graphene, including adsorbing reactive radicals onto a surface of the graphene and irradiating an energy source to the graphene on which the reactive radicals are adsorbed.

20 Claims, 13 Drawing Sheets

(56) References Cited

OTHER PUBLICATIONS

M. Wojtaszek et al. J.Appl.Phys. vol. 110, (2011) pp. 063715.*
Yang, Rong, et al. "An anisotropic etching effect in the graphene basal plane." Advanced materials 22.36 (2010): 4014-4019.
Kim, Yi Yeon, "Study on layer by layer control of the exfoliation graphene by using atomic layer etching", Thesis in SungKyunKwan University, Feb. 28, 2011 (61 pages, in Korean, with English Abstract).

International Search Report mailed Jan. 24, 2013 in counterpart International Application No. PCT/KR2012/005747 (2 pages, in English).

* cited by examiner

A graphene device
(Channel : Triple-layer graphene)

Au patterning

A graphene device
(Channel : Mono-layer graphene)

A graphene device
(Channel : Bi-layer graphene)

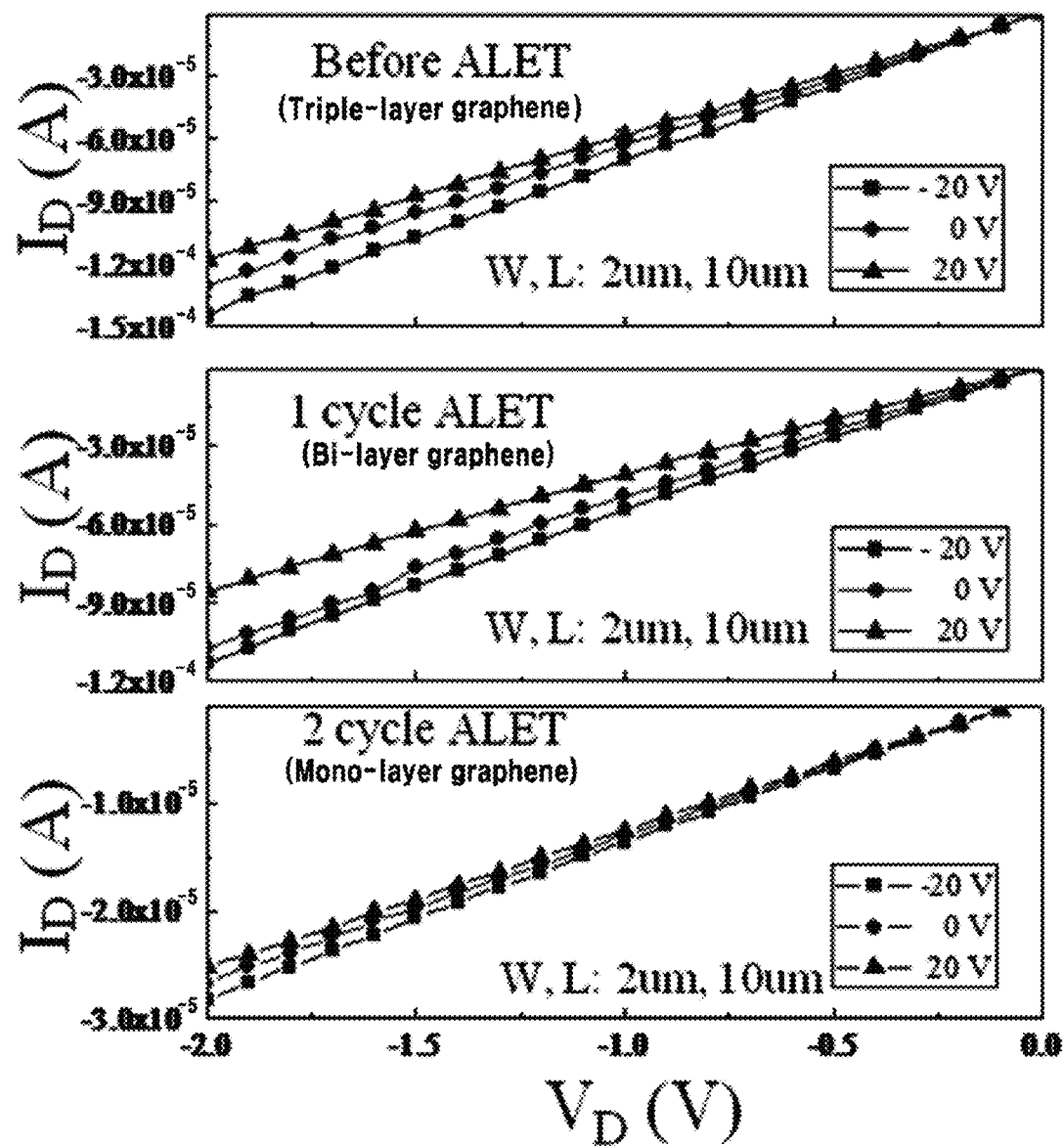

METHOD FOR ETCHING ATOMIC LAYER OF GRAPHENE

CROSS-REFERENCE TO RELATED APPLICATIONS

This application is a continuation of International Application No. PCT/KR2012/005747 filed on Jul. 19, 2012, claiming the priority based on Korean Patent Application No. 10-2011-0072843 filed on Jul. 22, 2011 and Korean Patent Application No. 10-2012-0074309 filed on Jul. 9, 2012, the contents of all of which are incorporated herein by reference in their entirety for all purposes.

BACKGROUND

1. Field

The various embodiments described herein pertain generally to an atomic layer etching method for graphene, including adsorbing reactive radicals onto a surface of the graphene and irradiating an energy source to the graphene on which the reactive radicals are adsorbed.

2. Description of Related Art

Exfoliated graphene has excellent physical and electrical characteristics. Due to these advantages, research on graphene has been actively conducted. In conventional methods of producing an exfoliated graphene, however, adjustment and positioning of graphene layers have been impossible. Thus, the exfoliated graphene produced by conventional methods has a problem in that it is less suitable to be commercialized for various purposes.

In this regard, recently, graphene produced by a chemical vapor deposition (CVD) method is attracting attention. The graphene produced by the CVD method has physical and electrical characteristics very similar to those of the exfoliated graphene produced by conventional methods and can be deposited on a wafer scale. Thus, research for the purposes of applying the graphene produced by the CVD method to a channel device or the like has been conducted in various ways.

However, in case of a device having only a channel portion of which is formed of graphene produced by the CVD method or the like, there may occur a contact failure between the graphene of the channel portion and a metal of source/drain electrodes. A metal [Au (25 nm)/Ti (10 nm)] electrode usually used as the source/drain electrodes in recent days has a very high contact resistance ranging from about 450Ω to about 800Ω against the graphene. Thus, degradation of a device characteristic may be caused. As an example of this conventional technique, Korean Patent Publication No. 10-2012-0048241 titled "Semiconductor device including graphene and manufacturing method thereof" describes a device including metal source/drain electrodes and a graphene channel.

Meanwhile, in order to solve the problems of the conventional methods of producing an exfoliated graphene, various new methods for etching an atomic layer of graphene have been under development. By way of example, an atomic layer etching method for graphene using HeIM (Helium Ion beam Microscopy), and an atomic layer etching method for graphene using $O_2$ plasma, etc., have been reported. According to these atomic layer etching methods for graphene, however, adjusting a graphene layer is not easy. Particularly, the atomic layer etching method for graphene using $O_2$ plasma has a drawback in that oxygen may remain at the edge of the graphene after the graphene is etched, thus affecting characteristics of the graphene.

SUMMARY

In view of the foregoing problems, illustrative embodiments provide an atomic layer etching method for graphene, capable of being used to etch graphene partially including a multiple number of stacked graphene thin films while minimizing physical and electrical damage on the graphene.

For example, this method can be used in manufacturing an improved device having source/drain electrodes and a channel layer all of which are made of graphene and, thus, having a minimized contact resistance, by partially etching graphene including a multiple number of stacked graphene thin films.

However, the problems sought to be solved by the present disclosure are not limited to the above description and other problems can be clearly understood by those skilled in the art from the following description. This Summary is provided to introduce a selection of concepts in a simplified form that are further described below in the Detailed Description. This Summary is not intended to identify key features or essential features of the claimed subject matter.

In one general aspect of an illustrative embodiment, there is provided an atomic layer etching method for graphene, including adsorbing reactive radicals onto a surface of graphene and irradiating an energy source to the graphene on which the reactive radicals are adsorbed.

By using the atomic layer etching method for graphene in accordance with the illustrative embodiment, it is possible to selectively control an etching depth of graphene easily while controlling the etching of the graphene on a unit of atoms. By way of example, by performing the atomic layer etching method for graphene a single time, it is possible to etch a mono-layer of graphene thin film, and by performing the atomic layer etching method for graphene two or more times, it is possible to selectively etch multiple number of layers of graphene thin films while adjusting them as desired, but not limited thereto.

Further, the atomic layer etching method for graphene in accordance with the illustrative embodiment also has advantages in that the process of the method is not complicated but easy and, thus, the method can be commercialized economically. The atomic etching method for graphene in accordance with the illustrative embodiment may include, basically, adsorbing reactive radicals onto a surface of graphene and irradiating an energy source to the graphene on which the reactive radicals are adsorbed, though other additional steps may be further included. Thus, the atomic etching method for graphene according to the illustrative embodiment can be performed easily and economically.

Furthermore, the process of adsorbing the reactive radicals onto the surface of the graphene, which is included in the atomic layer etching method for graphene in accordance with the illustrative embodiment, may have an advantageous effect of minimizing damage within a reaction chamber, which is configured to perform therein the etching of the graphene, by adsorbing the reactive radicals generated by plasma. For example, when adsorbing the reactive radicals onto the surface of the graphene by using a neutral beam including reactive radicals, it may be difficult to avoid contamination by carbon and metal due to the presence of a reflecting plate within an etching chamber. However, if the atomic layer etching method for graphene is performed by adsorbing the reactive radicals generated by the plasma onto the surface of the graphene according to the illustrative embodiment, the aforementioned problem such as occurrence of the contamination may be easily resolved.

Other features and aspects will be apparent from the following detailed description, the drawings, and the claims.

BRIEF DESCRIPTION OF THE DRAWINGS

In the detailed description that follows, embodiments are described as illustrations only, since various changes and modifications will become apparent from the following detailed description. The use of the same reference numbers in different figures indicates similar or identical items.

FIG. 5C provides a measurement result of $V_D$-$I_D$ according to a variation of a gate bias in the graphene device.

DETAILED DESCRIPTION

Figure 1A:
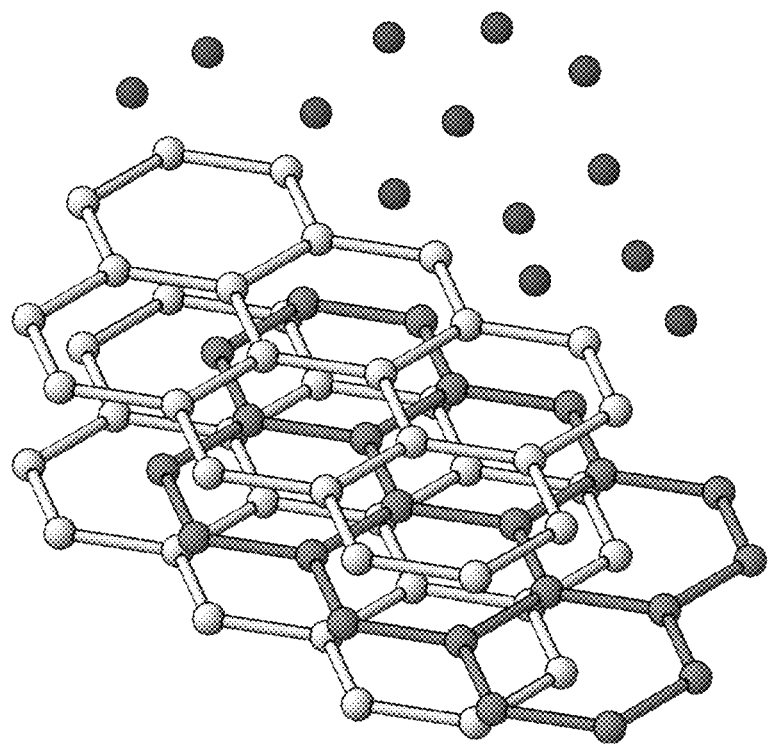
FIG. 1A to FIG. 1D are schematic diagrams for describing a sequence of an atomic layer etching process for graphene in accordance with an illustrative embodiment of the present disclosure.

Hereinafter, illustrative embodiments will be described in detail so that the inventive concept may be readily implemented by those skilled in the art. The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness. The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

However, it is to be noted that the present disclosure is not limited to the illustrative embodiments and examples but can be realized in various other ways. In drawings, parts not directly relevant to the description are omitted to enhance the clarity of the drawings, and like reference numerals denote like parts through the whole document.

Through the whole document, the term "comprise(s) or include(s)" and/or "comprising or including" used in the document means that one or more other components, steps, operation and/or existence or addition of elements are not excluded in addition to the described components, steps, operation and/or elements unless context dictates otherwise.

Through the whole document, the term "on" that is used to designate a position of one element with respect to another element includes both a case that the one element is adjacent to the another element and a case that any other element exists between these two elements.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

Through the whole document, the term "combination of" included in Markush type description means mixture or combination of one or more components, steps, operations and/or elements selected from the group consisting of components, steps, operation and/or elements described in Markush type and thereby means that the disclosure includes one or more components, steps, operations and/or elements selected from the Markush group.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "A and/or B" means "A or B" or "A and B."

Through the whole document, the term "atomic layer etching method," "atomic layer etching process" or "atomic layer etching technique (ALET)" means etching graphene while controlling the graphene on a unit of atoms in accordance with illustrative embodiments and examples of the present disclosure, but not limited thereto.

Although specific terminology has been used in this disclosure, it will be apparent to one of ordinary skill in the art that different terminology may used to describe the same features, and such different terminology may appear in other applications.

Hereinafter, illustrative embodiments and examples will be described in detail with reference to the accompanying drawings, which form a part hereof.

In accordance with one aspect of the present disclosure, there is provided an atomic layer etching method for graphene, including adsorbing reactive radicals onto a surface of graphene and irradiating an energy source to the graphene on which the reactive radicals are adsorbed.

In accordance with an illustrative embodiment, the atomic layer etching method for graphene may be performed repeatedly two or more times, but not limited thereto. By way of example, the atomic layer etching method for graphene may be performed from about two times to about five times, from about two times to about eight times, from about two times to about fifteen times, from about two times to about thirty times, from about two times to about sixty times, from about two times to about one hundred times, from about five times to about eight times, from about five times to about fifteen times, from about five times to about thirty times, from about five times to about sixty times, from about five times to about one hundred times, from about eight times to about fifteen times, from about eight times to about thirty times, from about eight times to about sixty times, from about eight times to about one hundred times, from about fifteen times to about thirty times, from about fifteen times to about sixty times, from about fifteen times to about one hundred times, from about thirty times to about sixty times, from about thirty times to about one hundred times, from about sixty times to about one hundred times, or more than about one hundred times, but not limited thereto.

In accordance with an illustrative embodiment, the graphene may include a multiple number of stacked layers of graphene thin films, but not limited thereto. By way of example, the graphene may include two to five layers, two to eight layers, two to fifteen layers, two to thirty layers, two to sixty layers, two to one hundred layers, five to eight layers, five to fifteen layers, five to thirty layers, five to sixty layers, five to one hundred layers, eight to fifteen layers, eight to thirty layers, eight to sixty layers, eight to one hundred layers, fifteen to thirty layers, fifteen to sixty layers, fifteen to one hundred layers, thirty to sixty layers, thirty to one hundred layers, sixty to one hundred layers, or more than one hundred layers of graphene thin films stacked on top each other, but not limited thereto.

In accordance with an illustrative embodiment, a single layer of graphene thin film included in the graphene may be etched by performing the atomic layer etching method for graphene a single time, but not limited thereto. By way of non-limiting example, it may be possible to etch a single layer of graphene thin film included in the graphene by performing the atomic layer etching method for graphene one time, and it may be also possible to etch two layers of graphene thin films included in the graphene by performing the atomic layer etching method for graphene twice. For example, a structure of the graphene may include a structure where the graphene thin films are stacked in multi-layers in a planar manner or in a stepped manner. In a configuration that the graphene thin films are stacked in the stepped manner, by performing the atomic layer etching method for graphene only a single time, not only the topmost single layer of graphene thin film but also underlying graphene thin films, a part of each of which is exposed, may also be etched, but not limited thereto. In order to include all of these cases, in the illustrative embodiment, it is described that "a single layer" of graphene thin film included in the graphene is etched by performing the atomic layer etching method for graphene a single time, but not limited thereto.

In accordance with an illustrative embodiment, the reactive radicals may include a reactive radical generated by plasma, but not limited thereto. For example, when performing an atomic layer etching process for graphene by adsorbing the reactive radicals generated by the plasma, it may be possible to achieve an advantageous effect such as minimization of damage within a reaction chamber configured to perform therein an etching process, but not limited thereto. By way of non-limiting example, when adsorbing reactive radicals onto the surface of the graphene by using a neutral beam including the reactive radicals, it might be difficult to avoid contamination by carbon and metal due to the presence of a reflecting plate within the chamber. In accordance with the illustrative embodiment, however, if the atomic layer etching process is performed by adsorbing the reactive radicals generated by the plasma, the aforementioned problem of the contamination or the like may be easily resolved. However, the advantageous effects of the illustrative embodiment may not be limited thereto.

In accordance with an illustrative embodiment, the plasma may be selected from the group consisting of O-based gas plasma, F-based gas plasma, H-based gas plasma, and combinations thereof, but not limited thereto. By way of example, the plasma may be of a type capable of being coupled to carbon, but not limited thereto. For example, the O-based gas plasma may refer to plasma obtained by injecting an oxygen-based gas such as, but not limited to, $CO_2$, $O_2$ or $NO_2$ into a plasma generator. For example, the F-based gas plasma may refer to plasma obtained by injecting a fluorine-based gas such as, but not limited to, $C_4F_8$, $CF_4$ or $CHF_3$ into the plasma generator. For example, the H-based gas may refer to plasma obtained by injecting a hydrogen-based gas such as, but not limited to, $NH_3$, $H_2$ or $SiH_4$ into the plasma generator.

In accordance with an illustrative embodiment, the reactive radicals may be selected from the group consisting of an O radical, an F radical, an H radical, an $O_2$ radical, an OH radical, an N radical, and combinations thereof, but not limited thereto. For example, in case that the reactive radicals are O radicals, F radicals or H radicals, the atomic layer etching process for graphene may be more efficiently performed owing to a strong binding force of those radicals. However, the illustrative embodiment may not be limited thereto.

In accordance with an illustrative embodiment, the atomic layer etching method for graphene may further include removing residue of the reactive radicals after adsorbing the reactive radicals, but not limited thereto.

In accordance with an illustrative embodiment, the energy source may be selected from the group consisting of a neutral beam, an ionic beam, heat energy, plasma, laser, and combinations thereof, but not limited thereto.

In accordance with an illustrative embodiment, the neutral beam may contain a non-reactive gas, but not limited thereto.

In accordance with an illustrative embodiment, the neutral beam may contain a gas selected from the group consisting of He, Ar, $N_2$, Ne, Xe, and combinations thereof, but not limited thereto.

In accordance with an illustrative embodiment, the atomic layer etching method for graphene may further include, after irradiating the energy source to the graphene, removing an etching by-product generated as a result of irradiating the energy source to the graphene, but not limited thereto.

In accordance with an illustrative embodiment, the atomic layer etching method for graphene may further include heating the graphene after removing the etching by-product, but not limited thereto. Here, the heating is different from heat energy used as the aforementioned energy source and is performed for different purpose from that of the energy source, which will be described in the following example of the illustrative embodiment.

In accordance with an illustrative embodiment, the heating process may be performed by an annealing process, but not limited thereto.

An atomic layer etching method for graphene in accordance with an illustrative embodiment may be performed as depicted in schematic diagrams of FIG. 1A to FIG. 1D. In the following, referring to FIG. 1A to FIG. 1D, the atomic layer etching method for graphene in accordance with the illustrative embodiment will be described in detail. However, the illustrative embodiment is not limiting in any way.

FIG. 1A is a schematic diagram illustrating a process of adsorbing reactive radicals onto a surface of graphene. In FIG. 1A, a multi-layer structure composed of repeated hexagonal ring patterns shown in the lower part of the drawing corresponds to graphene formed of multiple layers of graphene thin films stacked on top of each other, and scattered circular particles depicted in the upper part of the drawing correspond to reactive radicals. However, the shapes and the distributions of the graphene thin films and the reactive radicals may not be limited to the examples shown in the schematic diagram of FIG. 1A.

The graphene may be produced by using a method known in the art and may not be limited to graphene produced by any particular method. By way of example, the method for producing the graphene may include, but not limited to, a chemical vapor deposition method, a coating method, a heating method, a deposition method using a plasma source, an exfoliation method, and so forth. By way of example, the graphene may be grown by performing a chemical vapor deposition method on a metal catalyst layer, but not limited thereto.

For example, the metal catalyst layer may serve as a catalyst that facilitates the growth of the graphene, and there is no particular restriction in a material, a thickness and a shape of the metal catalyst layer. By way of non-limiting example, the metal catalyst layer may include at least one metal selected from the group consisting of Ni, Co, Fe, Pt, Au, Al, Cr, Cu, Mg, Mn, Mo, Rh, Si, Ta, Ti, W, U, V, Zr, brass, bronze, cupro-nickel, stainless steel, and Ge, or an alloy thereof, but not limited thereto.

For example, the chemical vapor deposition method may include, but not limited to, high temperature vapor deposition (HTCVD), rapid thermal vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD) and plasma-enhanced chemical vapor deposition (PECVD).

By way of example, the process for growing the graphene may be performed under an atmospheric pressure, under a low pressure or under a vacuum condition, but not limited thereto. By way of example, when performing the process for growing the graphene under an atmospheric pressure, by using, e.g., He as a carrier gas, it may be possible to minimize damage on the graphene that might be caused by collision with heavy Ar at a high temperature, but not limited thereto. For example, when performing the process under an atmospheric pressure, it may be possible to produce graphene of a large area with low cost and through a simple process, but not limited thereto. Furthermore, when performing the process under a low pressure or a vacuum condition, if hydrogen ($H_2$) is used as an environmental gas and a temperature is raised, an oxidized surface of the metal catalyst layer may be reduced and, thus, high-quality graphene can be grown, but not limited thereto.

By way of example, the reactive radicals may be selected from the group consisting of an O radical, an F radical, an H radical, an $O_2$ radical, an OH radical, an N radical, and combinations thereof, but not limited thereto.

For example, the reactive radicals may be generated by plasma. The plasma may be generated by injecting a gas selected from the group consisting of $O_2$, $N_2O$, $NO_2$, $CO_2$, and combinations thereof into the plasma generator and additionally injecting a gas selected from the group consisting of $H_2$, $D_2$, $H_2O$, and combinations thereof, but not limited thereto. By way of example, a flow rate of the gas selected from the group consisting of $O_2$, $N_2O$, $NO_2$, $CO_2$, and combinations thereof may be in the range from, e.g., about 5 sccm to about 5,000 sccm, but not limited thereto. By way of example, a flow rate of the gas selected from the group consisting of $H_2$, $D_2$, $H_2O$, and combinations thereof may be in the range from, e.g., about 10 sccm to about 10,000 sccm, but not limited thereto.

For example, the conditions for plasma generation, such as a power, a process pressure, a gas flow rate, etc., may be appropriately adjusted by those skilled in the art depending on a size of a chamber, but not limited thereto. By way of example, plasma having various frequencies or pulse plasma may be used, but not limited thereto. Further, the plasma generation process may be performed in a pressure range from, e.g., about $1e^{10}$ Torr (high vacuum) to about $1e^{-3}$ Torr (low vacuum), but not limited thereto.

By way of example, the plasma generation process may be performed at a RF power of, from e.g., about 0.5 kW to about 10 kW having a frequency range from, e.g., about 1 kHz to about 10 GHz and a bias power of, from e.g., about 1 W to about 5,000 W and under a chamber pressure condition ranging from, e.g., about 0.1 mTorr to about 500 mTorr, but not limited thereto. By way of example, if a frequency range, e.g., about 1 kHz or less is used in the plasma generation process, the frequency is so small that the plasma may become instable. On the other hand, if a frequency range about 10 GHz or more is used, energy transfer efficiency may be reduced, but not limited thereto.

For example, the RF power in the plasma generation process may be determined in proportion to the size of graphene. For example, as for graphene having a size of about 300 nm, it may be practically difficult to use a RF power less than about 0.5 kW, whereas if a RF power exceeding about 10 kW is used, it may be difficult to control the process because of an excessively high oxidation rate, but not limited thereto. For example, if a bias power higher than about 5000 W is applied in the plasma generation process, an attack on the graphene may be excessively increased, but not limited thereto.

By way of example, by adsorbing the reactive radicals onto the surface of the graphene as shown in FIG. 1A, the reactive radicals are allowed to be bonded to carbon atoms on the surface of the graphene, but not limited thereto. For example, as illustrated in FIG. 1A, by adsorbing the reactive radicals on the surface of the graphene, a bond between the carbon atoms on the surface of the graphene may be converted from a $sp^2$ bond to a $sp^3$ bond, but not limited thereto. In case that the bond between the carbon atoms in the surface of the graphene is converted from the $sp^2$ bond to the $sp^3$ bond, it may be possible to eliminate only a graphene thin film on the surface of the graphene, which has undergone through the change in the bond, by adsorption of highly volatile substances.

For example, when oxygen (O) radicals are used as the reactive radicals, a surface of the graphene, before the oxygen radicals are injected, is composed of $sp^2$ bonds, and a C—O bond hardly exists. If the oxygen radicals are injected into the surface of the graphene, adsorption of carbon atoms and oxygen atoms may progress, so that a $sp^3$ bond and a C—O bond may be generated on the surface of the graphene, but not limited thereto.

Figure 1B:
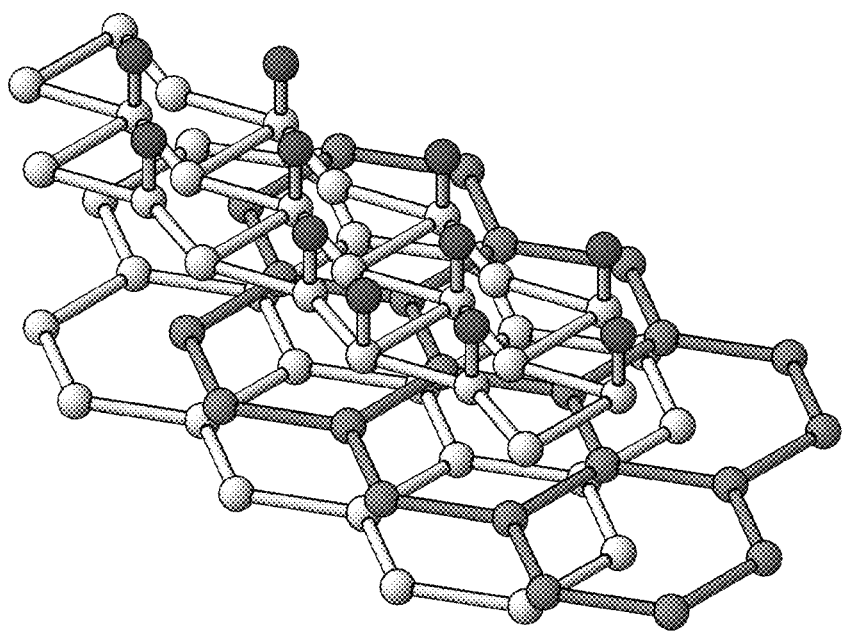

FIG. 1B is a schematic diagram for illustrating a process of removing residual reactive radicals that are not adsorbed onto the graphene after the process of FIG. 1A is completed. In FIG. 1B, the reactive radicals shown to be scattered at the upper part of the drawing in FIG. 1A are eliminated, and, instead, the reactive radicals are shown to be adsorbed on the surface of the graphene at the lower part of the drawing, but not limited thereto.

For example, in order to eliminate the residual reactive radicals that are not chemically adsorbed onto the graphene, there may be employed, but not limited to, a method of purging the residual reactive radicals by supplying a nonreactive gas such as a nitrogen gas through an injection opening of the reaction chamber. To elaborate, the graphene on which the reactive radicals are adsorbed may have a C—O bond at the surface thereof. In this state, by performing a purge by way of supplying a nitrogen gas for about 30 seconds, by-products including the residual radicals remaining on the graphene may be eliminated, and the purged by-products may be discharged out through a discharge opening, but not limited thereto. Besides the purging method, it may be also possible to eliminate the by-products including the residual reactive radicals by using, but not limited to, a pumping process.

Figure 1C:
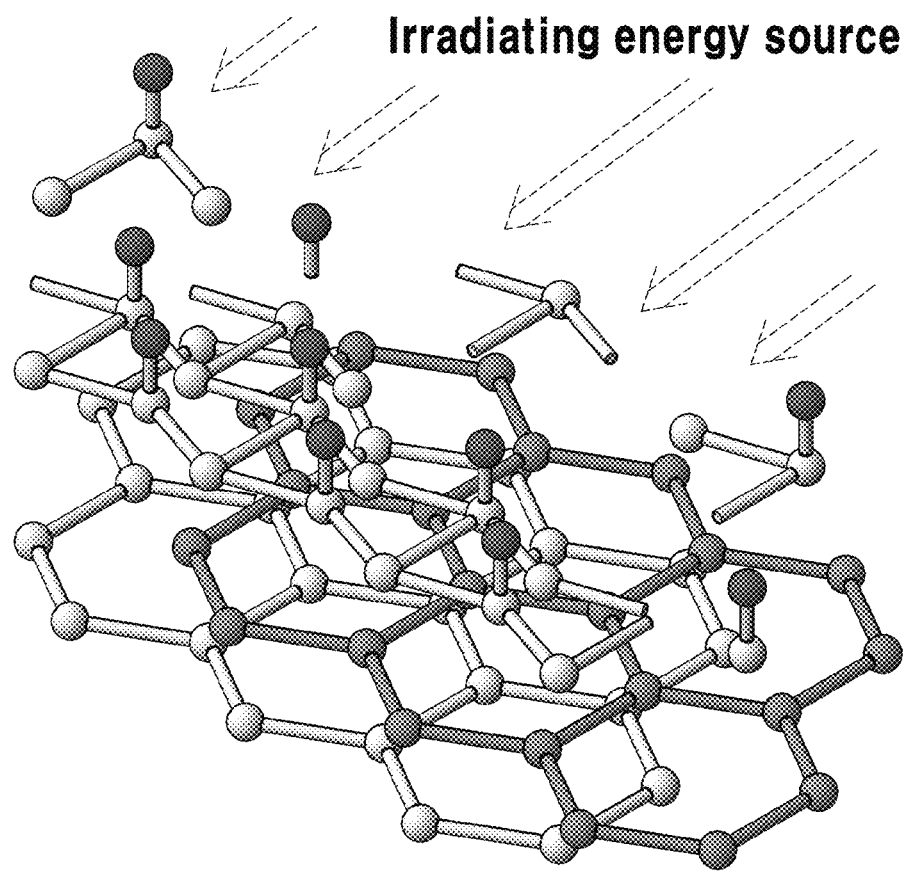

FIG. 1C is a schematic diagram for illustrating a process of irradiating an energy source to the graphene on which the reactive radicals are adsorbed after the process of FIG. 1B is completed. Referring to FIG. 1C, by irradiating the energy source, which is indicated by a shaded plane portion, to the graphene on which the reactive radicals are adsorbed, a coupling between a graphene thin film at the surface on which the reactive radicals are adsorbed and another graphene thin film underlying it or between the graphene thin film at the surface and a base underlying it may be weakened, thus accelerating separation and etching of the graphene thin film at the surface on which the reactive radicals are adsorbed, but not limited thereto.

By way of example, by irradiating the energy source to the graphene on which the reactive radicals are adsorbed, a $sp^3$ bond formed at the surface of the graphene or a carbon atom at the surface of the graphene to which a reactive radical is bonded may be separated from the another graphene thin film or the base underlying it, so that a mono-layer of graphene may be etched, but not limited thereto.

By way of example, the process of irradiating the energy source may be performed by using various types of energy source generating apparatuses, but not limited thereto. By way of example, the energy source may be irradiated by using various kinds of energy source generating apparatuses capable of applying energy higher than about 0 eV and equal to or lower than about 40 eV, but not limited thereto. For example, the energy of the energy source irradiated to the graphene on which the reactive radicals are adsorbed may be, e.g. higher than about 0 eV and equal to or less than about 10 eV, higher than about 0 eV and equal to or less than about 20 eV, higher than about 0 eV and equal to or less than about 30 eV, higher than about 0 eV and equal to or less than about 40 eV, or in the range from about 10 eV to about 20 eV, from about 20 eV to about 30 eV, from about 10 eV to about 40 eV, from about 20 eV to about 30 eV, from about 20 eV to about 40 eV or from about 40 eV to about 30 eV, but not limited thereto.

By way of example, the energy source may be selected from the group consisting of a neutral beam, an ionic beam, heat energy, plasma, laser, and combinations thereof, but not limited thereto. For example, the neutral beam may contain a nonreactive gas, and in case of using the neutral beam containing the nonreactive gas, it may be possible to achieve an advantageous effect of preventing contamination by carbon and metal that might be caused by the reflecting plate within the etching chamber, but not limited thereto. For example, the neutral beam may contain a gas selected from the group consisting of He, Ar, $N_2$, Ne, Xe, and combinations thereof, but not limited thereto.

Figure 1D:
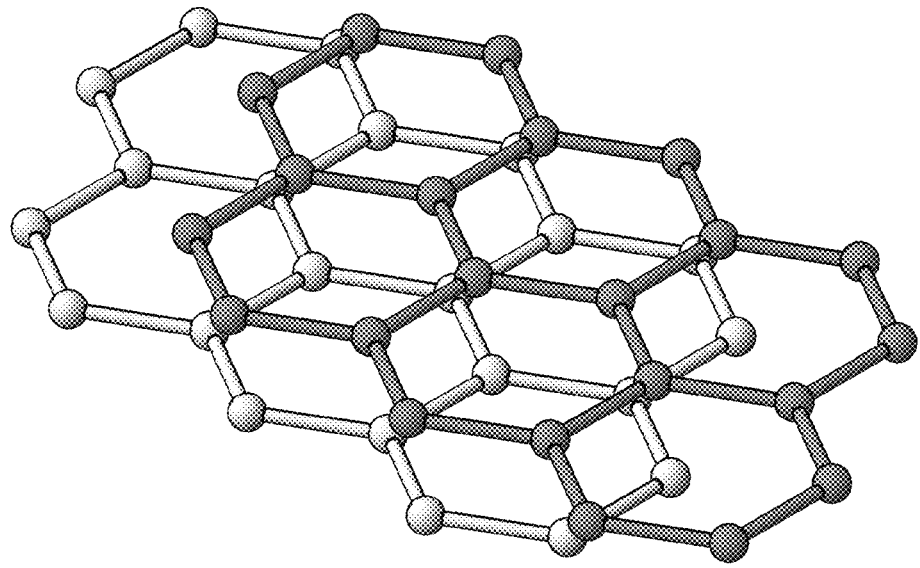

FIG. 1D is a schematic diagram for illustrating a process of eliminating an etching by-product generated as a result of irradiating the energy source after the process of FIG. 1C is completed. Referring to FIG. 1D, it is observed that an etching by-product, which is shown at the upper part of FIG. 1C, is eliminated. Further, as compared to FIG. 1A, it is observed that a mono-layer of graphene thin film located at the surface of the graphene, which is shown at the lower part of the drawing, is eliminated.

By way of example, in order to eliminate the etching by-product, there may be employed, but not limited to, a method of purging the etching by-product by supplying a nonreactive gas such as a nitrogen gas through the injection opening of the reaction chamber. To elaborate, the etching by-product may be eliminated by supplying a nitrogen gas for about 30 seconds, and the purged etching by-products may be discharged out through the discharge opening, but not limited thereto. Besides this purging method, it may be also possible to eliminate the etching by-products by using, but not limited to, a pumping process.

By way of example, in the atomic layer etching method for graphene in accordance with the exemplary embodiment as shown in FIG. 1A to FIG. 1D, by performing the above-described series of processes only one time, a mono-layer of graphene thin film included in the graphene can be etched. Further, for example, by performing the series of processes included in the atomic layer etching method as shown in FIG. 1A to FIG. 1D plural times, it may be possible to form graphene having a required thickness, but not limited thereto.

By way of example, the atomic layer etching method for graphene may further include a process of heating the graphene after the completion of the process of FIG. 1D, but not limited thereto. For example, the heating process may be performed by, but not limited to, an annealing process.

The annealing may not be particularly limited and may be appropriately selected from various annealing methods known in the art by those skilled in the art. By way of example, the annealing may be performed by a thermal processing at a processing temperature ranging from, e.g., about 400° C. to about 1,000° C. under a gas atmosphere selected from the group consisting of Ar, $O_2$, $N_2$, $O_3$, $N_2O$, $H_2O_2$, $H_2O$, and combinations thereof for about 4 minutes to about 30 minutes, but not limited thereto. Alternatively, the annealing may be performed by a rapid thermal processing (RTP) at a processing temperature ranging from, e.g., about 600° C. to about 1200° C. under a gas atmosphere selected from the group consisting of Ar, $O_2$, $N_2$, $O_3$, $N_2O$, $H_2O_2$, $H_2O$, and combinations thereof for from about a second to about 10 seconds, but not limited thereto. For example, the rapid thermal processing may be performed for the purpose of improving an oxidation quality, but not limited thereto.

By way of example, in the process of irradiating the energy source of FIG. 1C, the energy source having high energy may inflict a physical damage not only on the surface of the graphene but also on an underlying graphene thin film. Such a physical damage may cause a conversion of a bond between the carbon atoms of the underlying graphene thin film from a $sp^2$ bond to a $sp^3$ bond. However, by performing the annealing process additionally, it may be possible to complement the physical damage incurred at the underlying graphene thin film. For example, if physical damage is caused to a part of the underlying graphene thin film in the process of irradiating the energy source of FIG. 1C, the $sp^2$ bond between the carbon atoms may be converted to the $sp^3$ bond and a D peak may be increased. Here, if a heating process such as annealing is additionally performed, re-crystallization of the carbon atoms may occur, so that the $sp^3$ bond may be decreased and the $sp^2$ bond may be increased, resulting in an increase of a 2D peak. That is, the heating process such as the annealing additionally performed after the process of FIG. 1D may be performed to alleviate or complement the physical damage on the underlying graphene thin film that might be unintentionally caused in the process of irradiating the energy source of FIG. 1C, but not limited thereto.

Below, examples of the illustrative embodiments will be described. However, the following examples are intended to facilitate understanding of the present disclosure and therefore are not intended to limit its scope.

EXAMPLES

1. Method for Performing Atomic Layer Etching of Graphene and Analysis Thereof

In this example, in order to generate $O_2$ radicals as reactive radicals to be adsorbed onto a surface of graphene, a RF power (13.56 MHz) of about 300 W was applied to an ICP plasma source. Further, the $O_2$ radicals were designed to reach the surface of the sample by pumping flow.

Meanwhile, in order to produce an Ar neutral beam as an energy source to be irradiated to the graphene on which the reactive radicals were adsorbed, a RF power (13.56 MHz) of about 300 W was applied to the ICP plasma source. Here, the Ar neutral beam was produced by using a low angle forward reflected neutral (LAFRN) beam technique. The LAFRN beam technique is a method for extracting an Ar neutral beam by using a three grid system and a reflector after producing ICP-type plasma.

To adjust energy of the Ar neutral beam, the three grid system including a first to a third grid was utilized. Here, the first grid was an accelerating grid configured to adjust energy of an $Ar^+$ ion beam and about 30 V was applied thereto; the second grid was an extractor grid configured to adjust a flux and about −150 V was applied thereto; and the third grid was grounded.

Meanwhile, in this example, graphene produced by using a CVD method was used as the graphene to which an atomic layer etching technique in accordance with the present disclosure was to be applied. The CVD process for producing the graphene was performed by referring to the disclosure in Reference Document "Large-Scale Pattern Growth of Graphene Films for Stretchable Transparent Electrodes" [Keun Soo Kim et. al, Nature, 457,07719 (2009)].

Detailed experiment conditions for the atomic layer etching technique (ALET) for graphene were specified in the following Tables 1 to 3. To elaborate, Table 1 shows conditions for $O_2$ plasma; Table 2, conditions for Ar plasma; Table 3, conditions for annealing.

TABLE 1

| Basic Pressure | $3.0 \times 10^{-7}$ Torr |
| Operating Pressure | $8.9 \times 10^{-5}$ Torr |
| Inductive Power | 300 Watts |
| $1^{st}$ Grid Voltage | No Bias |
| $2^{nd}$ Grid Voltage | No Bias |
| $O_2$ Gas Flow rate | 20 sccm |
| $O_2$ Radical Exposure Time | 5 min |

TABLE 2

| Basic Pressure | $3.0 \times 10^{-7}$ Torr |
| Operating Pressure | $8.9 \times 10^{-5}$ Torr |
| Inductive Power | 300 Watts |
| $1^{st}$ Grid Voltage | 30 V |
| $2^{nd}$ Grid Voltage | −150 V |
| Ar Gas Flow rate | 30 sccm |
| Ar Radical Exposure Time | 1 min |

TABLE 3

| Mixing ratio of $H_2$:He | 42:1 |
| Operating Pressure | 130 mTorr |
| Temperature | 1000° C. |
| Time | 30 min |

Meanwhile, in the present example, Micro-Raman Spectrometer (Renishaw-Invia Basic) and UV-Spectrometer (Shimadzu UV-3600) were used to investigate graphene characteristics after performing the atomic layer etching process for the graphene. Further, in order to observe a change in carbon bonds on the surface of the graphene, an angular resolved X-ray photoelectron spectroscopy (ARXPS, Thermo VG, MultiLab 2000, Mg Kα source) was utilized. After producing triple-layer graphene by the CVD method according to the present example, a graphene device was produced by etching the graphene according to the atomic layer etching process of the present example. The characteristics of the graphene device were investigated by using Keithley 4200 Unit.

2. Analysis of Result of Performing Atomic Layer Etching of Graphene

FIG. 1A to FIG. 1D are diagrams showing four steps of the atomic layer etching technique (ALET) of the present example. To elaborate, the four steps were performed as follows: (FIG. 1A) by adsorbing the oxygen radicals onto the surface of the graphene for about 5 minutes, a bond between carbon atoms at the surface of the graphene was changed from a $sp^2$ bond to a $sp^3$ bond; (FIG. 1B) residual oxygen radicals are discharged out for about 30 seconds; (FIG. 1C) by irradiating the Ar neutral beam for about 60 seconds as an energy source, a C—O bond and a $sp^3$ bond at the surface of the graphene were desorbed; (FIG. 1D) the C—O bond or the like as an etching by-product was discharged out for about 30 seconds.

To be more specific, FIG. 1A is a schematic diagram illustrating a process of converting a $sp^2$ bond at the surface of the graphene to a $sp^3$ bond by using the oxygen radicals. In general, since the surface of the graphene has a highly stabilized structure, chemisorptions may not occur at the surface of the graphene even if a general $O_2$ gas is injected for about 10 minutes. In this example, however, a change in the carbon bonds at the surface of the graphene was induced by irradiating the oxygen radicals having high reactivity for only about 5 minutes. As in this case, when the oxygen radicals are adsorbed onto the surface of the graphene, the bonds between the carbon atoms at the surface of the graphene may be converted from the $sp^2$ bond to the $sp^3$ bond. Since the binding force of the $sp^3$ bond is weaker than that of the $sp^2$ bond, if the Ar neutral beam is irradiated as the energy source in the subsequent process, the $sp^3$ bond, rather than the $sp^2$ bond, may be easily cut, so that the surface layer of the graphene at which the $sp^3$ bond is formed may be selectively eliminated.

Figure 2A:
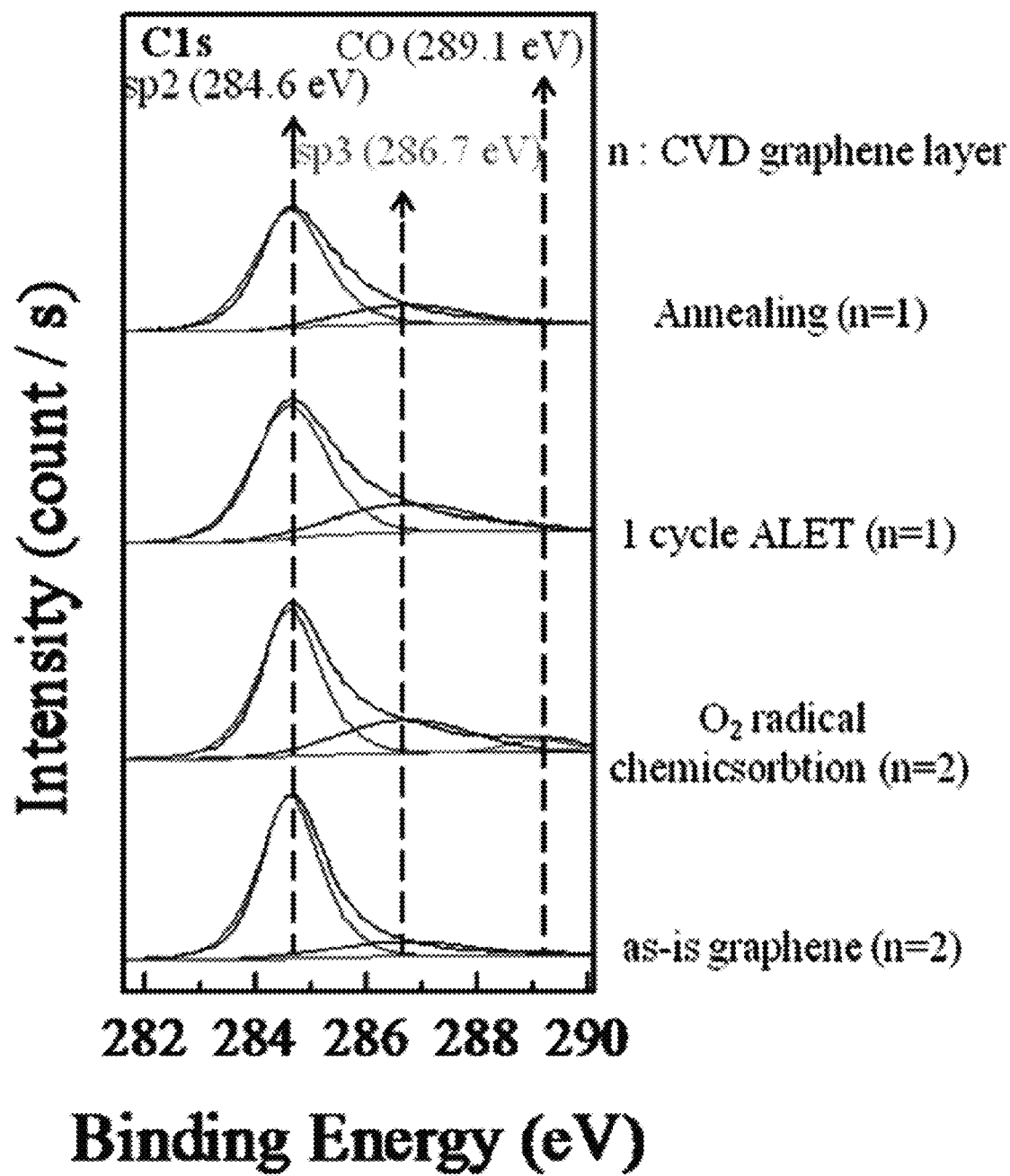
FIG. 2A and FIG. 2B are XPS spectra recorded when performing an atomic layer etching process for graphene in an illustrative embodiment.

In this regard, FIG. 2A is a chart showing a result of observing through X-ray photoelectron spectroscopy, when performing an atomic layer etching process for a bi-layer graphene, a change from a $sp^2$ bond to a $sp^3$ bond at the surface of the graphene onto which the oxygen radicals are adsorbed. Before the oxygen radicals were injected, about 83% or more of the surface of the graphene was composed of $sp^2$ bonds (284.6 eV), and a C—O bond hardly existed at the surface of the graphene, almost 0%. However, if the oxygen radicals were injected onto the surface of the graphene, it was observed that adsorption of carbon atoms and oxygen atoms progressed at the surface of the graphene, and, thus, about 42.87% of sp$^3$ bond (286.7 eV) and about 11.68% of C—O bond (288.0 eV) were found to be formed at the surface of the graphene.

Figure 2B:
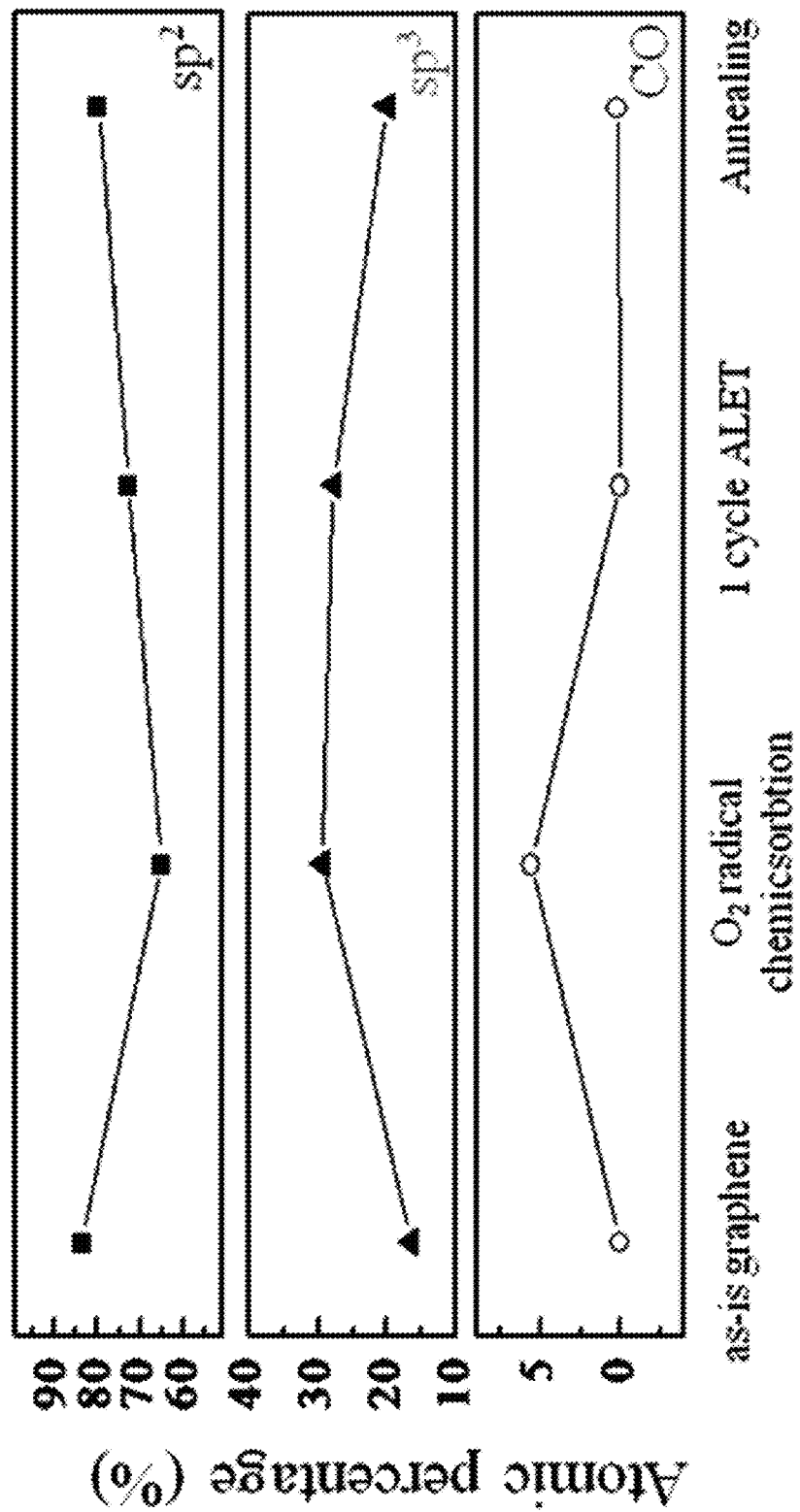

Meanwhile, FIG. 1C is a schematic diagram illustrating a process of desorbing the sp$^3$ bonded carbon atoms at the surface of the graphene by irradiating the Ar neutral beam as the energy source. As shown in FIG. 2B, it was observed that the C—O bonds was reduced from about 11.68% to 0% after the desorbing process by the irradiation of the Ar neutral beam.

Figure 3A:
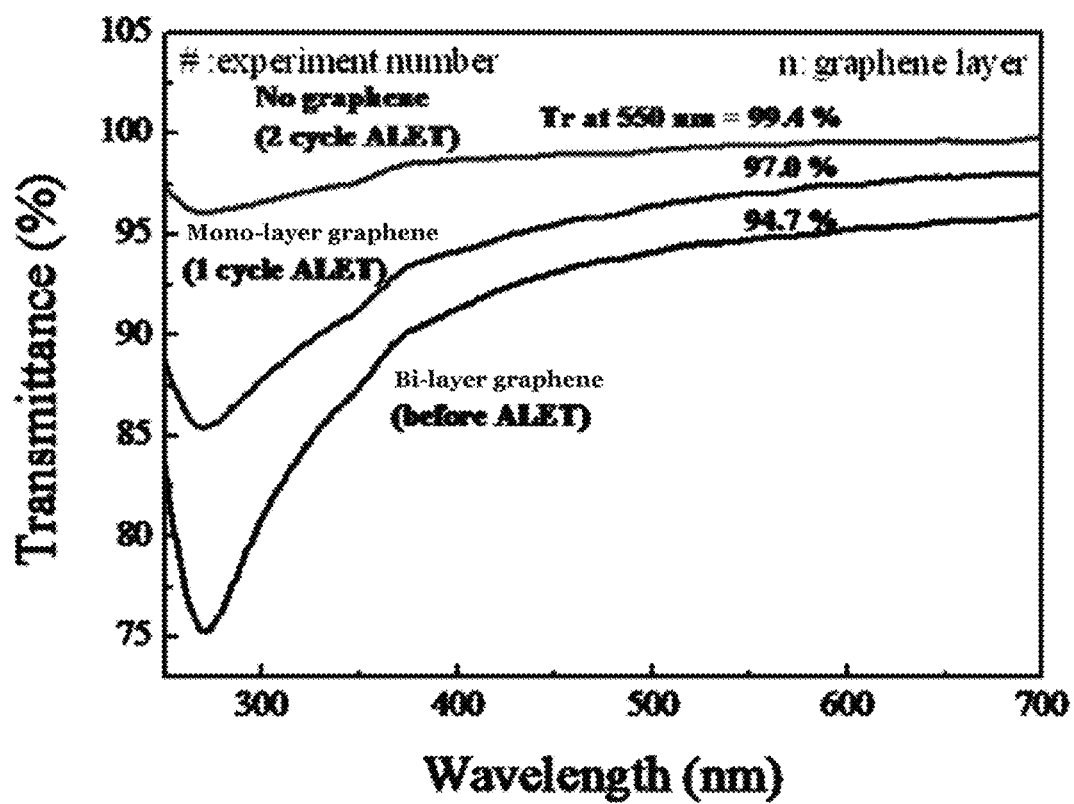
FIG. 3A is a graph showing a measurement of light transmittance in relation to a repetition number of the atomic layer etching process for graphene, which is measured by using an UV spectra in the illustrative embodiment.
Figure 3B:
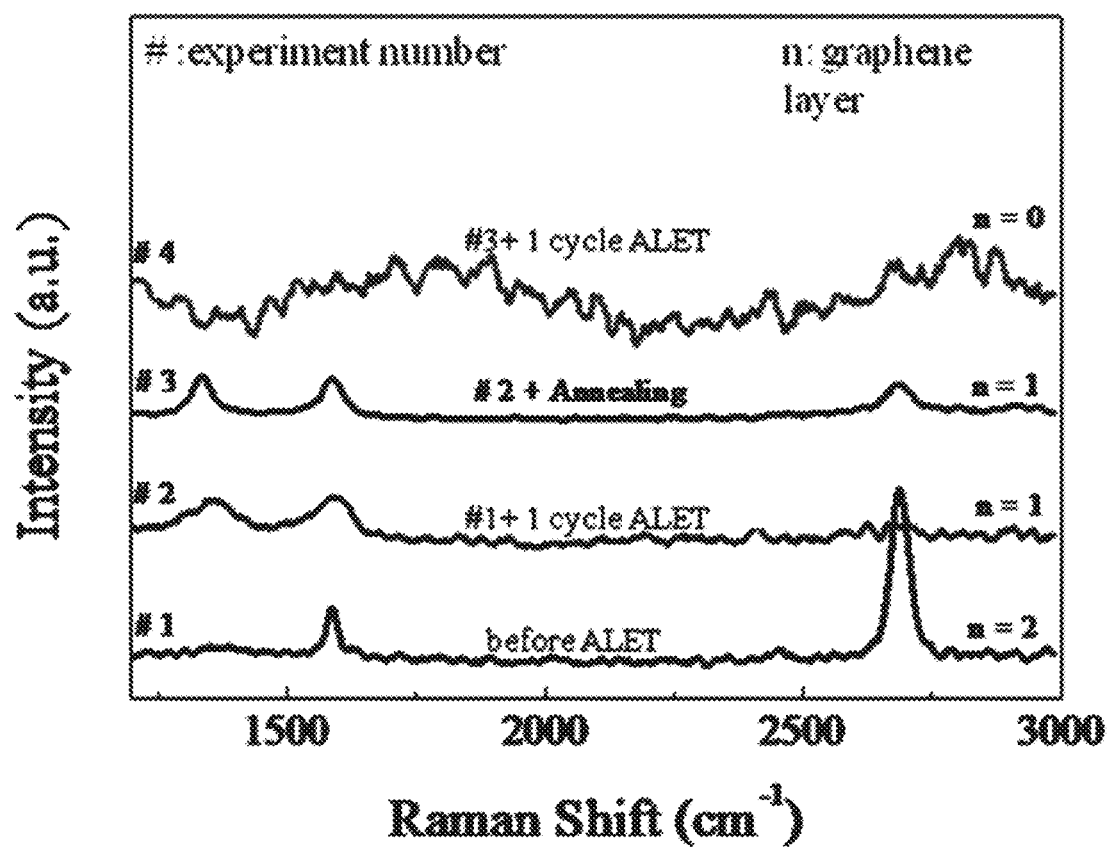
FIG. 3B is a graph showing Raman spectra in relation to a repetition number of the atomic layer etching process for graphene.

Meanwhile, FIG. 3A is a graph showing measurements of light transmittance in relation to the repetition number of the atomic layer etching process for graphene, which was measured by UV spectra in an example of the illustrative embodiment. FIG. 3B is a graph showing Raman spectra according to the repetition number of the atomic layer etching process for graphene, and FIG. 3C is a SEM image of mono-layer or bi-layer graphene formed after the atomic layer etching process for the graphene is performed.

As for the light transmittance shown in FIG. 3A, in case of depositing graphene by using a CVD method, it is known that about 2.3% of light transmittance decreases whenever a mono-layer of graphene thin film is formed. In this example, by using light transmittance, it was investigated whether an atomic layer of graphene is etched. For illustrative purposes, bi-layer graphene was formed on a quartz substrate, and a variation in light transmittance was measured while performing an atomic layer etching on the bi-layer graphene. Prior to performing the atomic layer etching process, the bi-layer graphene showed a light transmittance of about 94.7%. After the atomic layer etching process for the graphene was conducted once, the light transmittance was found to reach about 97% with an increment of about 2.3%, and after the atomic layer etching process for the graphene was performed one more time, the light transmittance was found to reach about 99.4% with an additional increment of about 2.4%. This variation in the light transmittance as depicted in FIG. 3A shows that the atomic layer etching technique for graphene was successfully performed according to the present example.

As for the Raman spectra shown in FIG. 3B, generally, exfoliated graphene may exhibit a G/2D ratio of about 1. However, the Raman spectra of the bi-layer graphene formed by the CVD method are known to be similar to that of a mono-layer graphene, because AB stacking (stacking between two graphene layers) is not matched. As depicted in FIG. 3B, when the atomic layer etching process was performed on the graphene, a D peak was formed and a 2D peak was eliminated due to Ar neutral particles having a small quantity of high energy contained in the Ar neutral beam. That is, the energy source such as the Ar neutral beam inflicted a physical damage on an underlying graphene thin film as well, causing bonds between carbon atoms in the underlying graphene thin film to be changed from sp$^2$ bonds to sp$^3$ bonds. As a result, a D peak was found to increase greatly. However, in the case of performing an annealing process at about 1000° C. for about 30 minutes as an additional heating process, it was observed that re-crystallization of the carbon atoms progressed in the underlying graphene thin film due to heat energy and a 2D peak was recovered. Even in this case, however, the D peak was not completely removed because a perfect graphene surface structure could not be formed as the re-crystallization progressed partially. Further, the XPS result of FIG. 2A also proved that the sp$^3$ bond decreased whereas the sp$^2$ bond increased as a result of performing the additional heating process such as the annealing process.

Figure 3C:
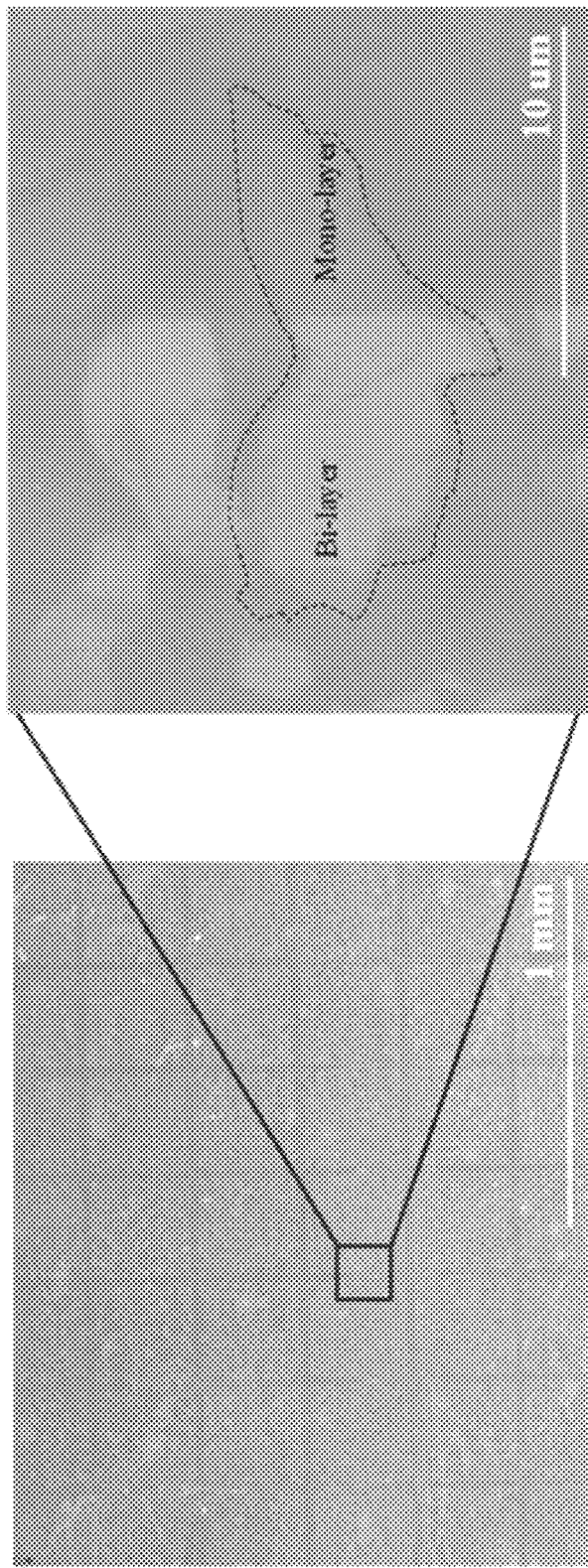
FIG. 3C provides SEM images of mono-layer graphene and bi-layer graphene formed after the atomic layer etching process for graphene was performed.

Meanwhile, FIG. 3C provides SEM images in case of forming mono-layer graphene and bi-layer graphene through the process of forming a pattern on bi-layer graphene and etching the graphene. That is, the SEM images were captured after forming a pattern on the bi-layer graphene and then performing an atomic layer etching process thereon a single time. Through the SEM images of FIG. 3C, it could be found out that the mono-layer graphene and the bi-layer graphene maintained their shapes while the etching progressed. Further, in case of performing an etching process by using an O$_2$ gas according to a conventional method, the etching takes place partially. Referring to FIG. 3C, however, it was observed that the atomic layer etching progressed across the entire region of the graphene as a result of performing the atomic layer etching process in accordance with the present disclosure. The etching process was found to progress in a similar way in both exfoliated graphene and flower graphene.

Figure 4A:
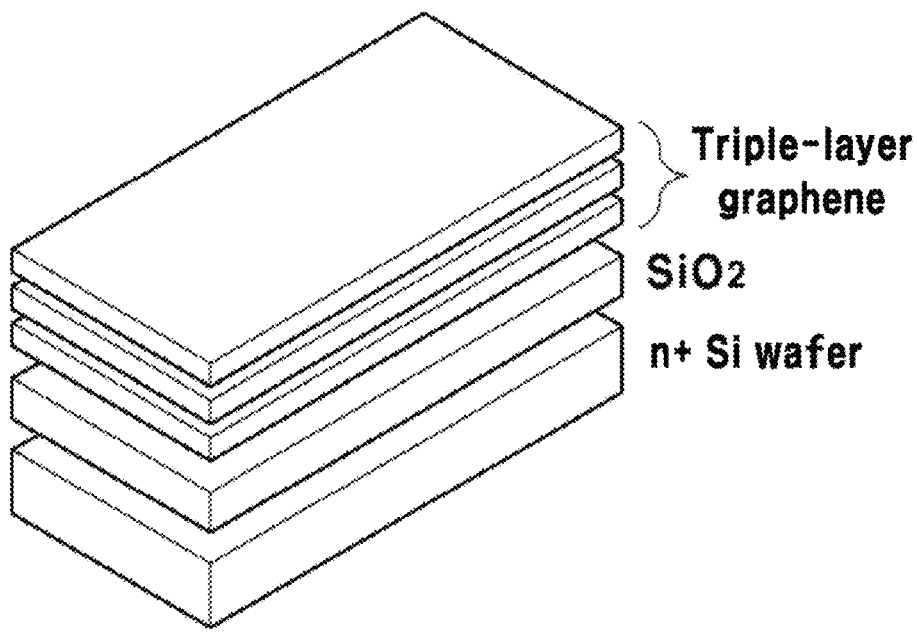
FIG. 4A to FIG. 4F are schematic diagrams illustrating a sequence of a process of producing a graphene device by using an atomic layer etching process for graphene in accordance with an illustrative embodiment.
Figure 4B:
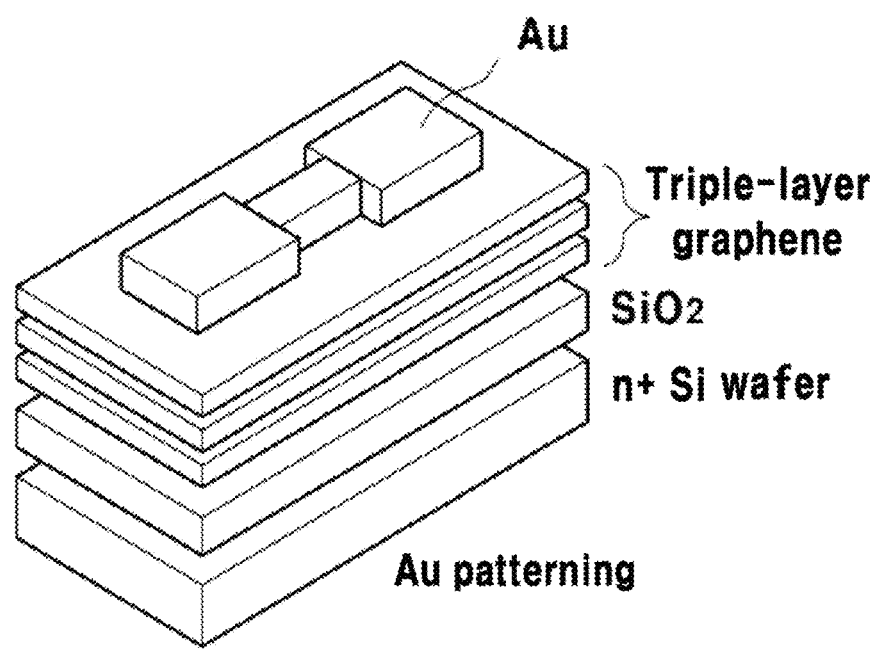
Figure 4C:
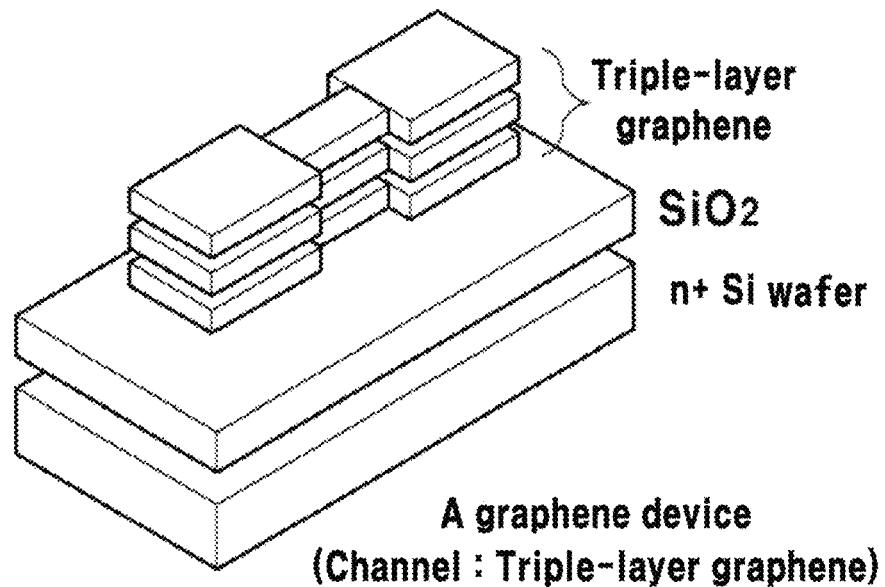
Figure 4D:
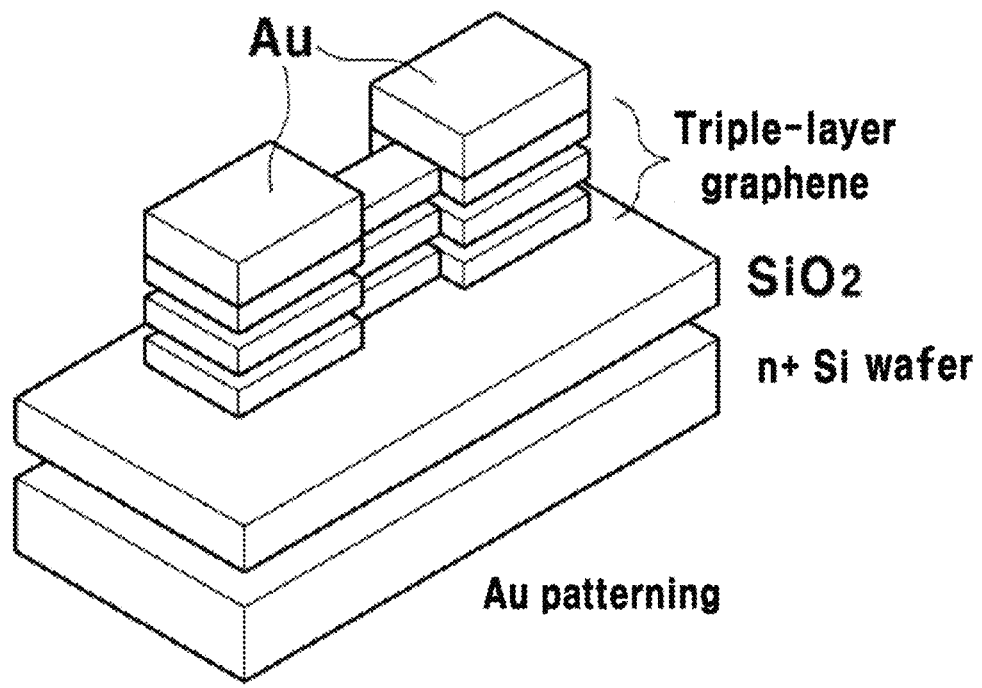
Figure 4E:
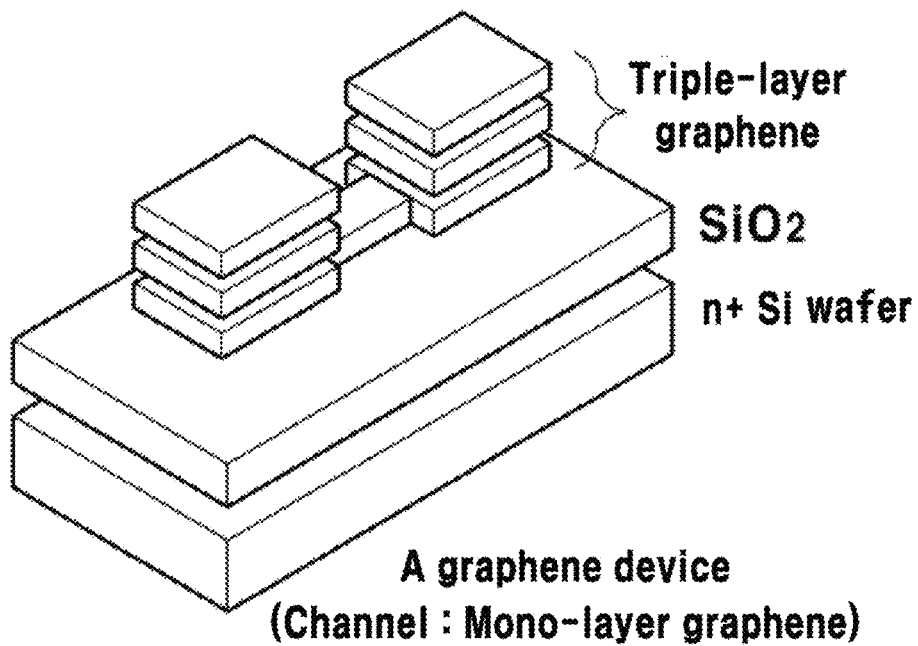
Figure 4F:
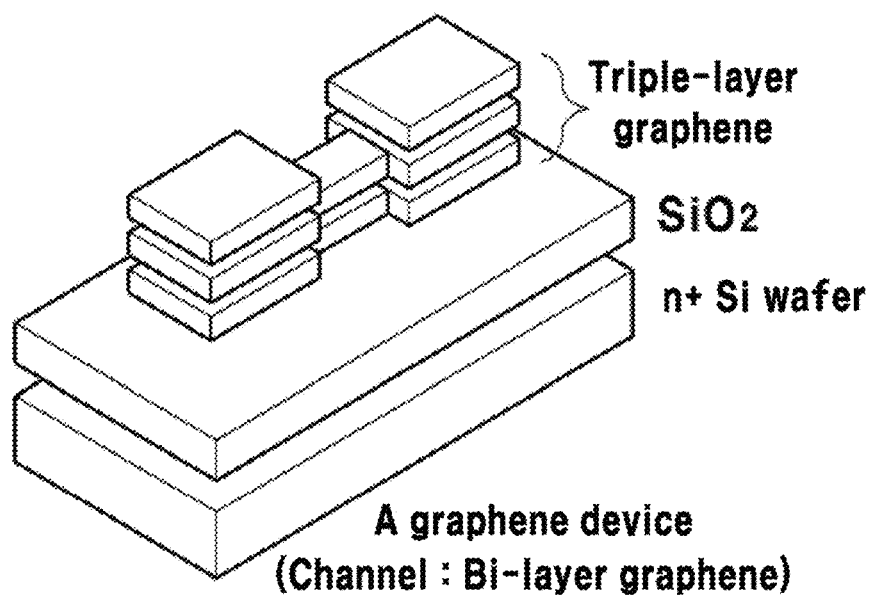

FIG. 4A to FIG. 4F are schematic diagrams illustrating a sequence of manufacturing a graphene device by using the atomic layer etching process for graphene in accordance with the present example. To elaborate, as shown in FIG. 4A, triple-layer graphene was formed on a substrate composed of SiO$_2$ deposited on a n$^+$ Si wafer, and, as shown in FIG. 4B, Au was deposited in a thickness of about 20 nm to produce an Au mask. Then, as shown in FIG. 4C, an atomic layer etching process for graphene was repeatedly performed three times by using the deposited Au as an etching mask, so that a source electrode, a drain electrode and a graphene channel having a width of about 2 μm and a length of about 10 μm were formed. Subsequently, as depicted in FIG. 4D, Au was re-deposited as an etching mask to adjust a stacking degree of the graphene channel. Then, by performing the atomic layer etching process for the graphene, the graphene channel was adjusted to mono-layer graphene as depicted in FIG. 4E or to bi-layer graphene as depicted in FIG. 4F.

Figure 5A:
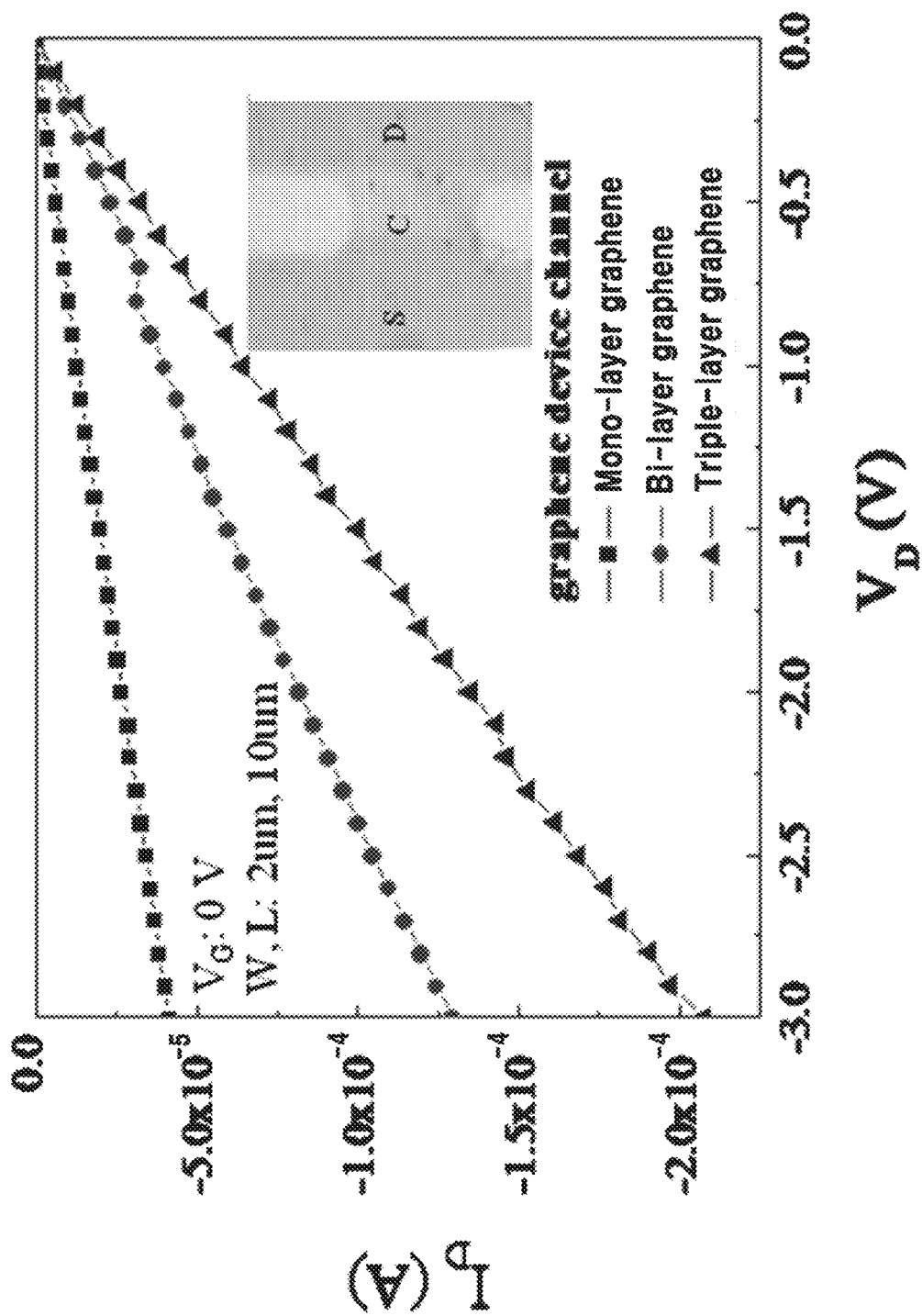
FIG. 5A provides a measurement result of $V_D$-$I_D$ as a result of etching an atomic layer of graphene in a graphene device produced by the process depicted in FIG. 4A to FIG. 4F.
Figure 5B:
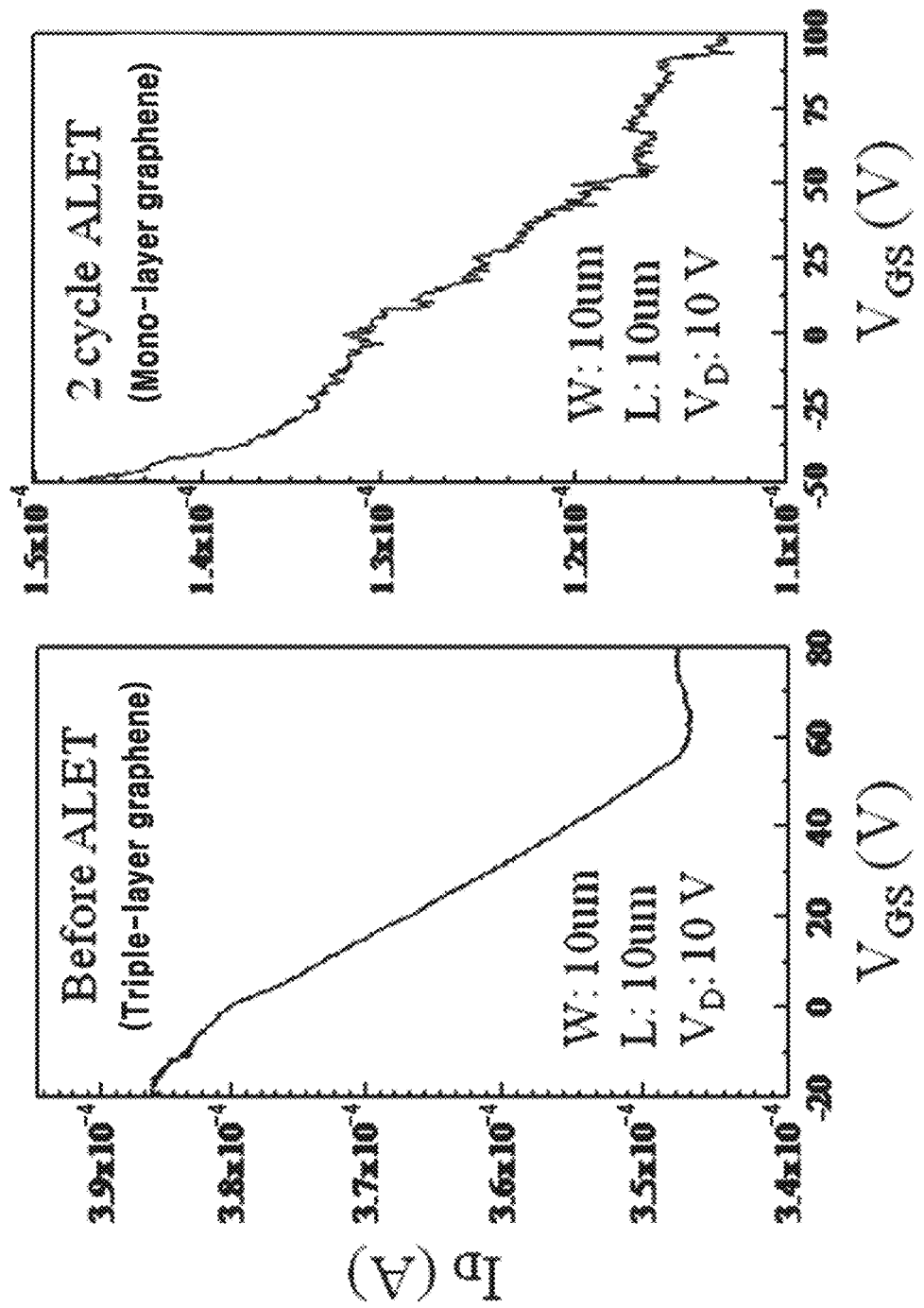
FIG. 5B provides measurements of $V_{GS}$-$I_D$ before and after the etching of the atomic layer of the graphene is performed.

Meanwhile, FIG. 5A provides measurement results of $V_D$-$I_D$ after an atomic layer of graphene is etched in a graphene device produced according to the processes of FIG. 4A to FIG. 4F. An illustration in FIG. 5A is an optical image of the graphene device. FIG. 5B provide graphs showing $V_{GS}$-$I_D$ values before and after the atomic layer etching of the graphene is etched in the graphene device. FIG. 5C provides measurement results of $V_D$-$I_D$ according to a variation in a gate bias in the graphene device. In FIG. 5A, it was observed that $I_D$ decreased as the repetition number of the atomic layer etching process for the graphene increased. This result reflects that layers of graphene thin films of the graphene channel decreased one by one as the repetition number of the atomic layer etching process increased. Further, as can be seen from the illustration of FIG. 5A, triple-layer graphene existed at the source electrode (S) and the drain electrode (D), whereas a mono-layer graphene existed at the graphene channel (C) as a result of the atomic layer etching process. Further, an on-off ratio could be investigated by comparing $V_{GS}$-$I_D$ of the triple-layer graphene device prior to performing the atomic layer etching process, which is shown in the left part of FIG. 5B, and $V_{GS}$-$I_D$ of the mono-layer graphene device after performing the atomic layer etching process twice, which is shown in the right part of FIG. 5B. Further, referring to FIG. 5C, as a result of measuring $V_D$-$I_D$ according to a variation of the gate bias in the graphene device, it was observed that a general graphene characteristic was exhibited. From this result, it was proved that damage on the surface of the graphene could be alleviated by performing the annealing process.

Through this example, it was proved that the graphene device produced by applying the atomic layer etching process for graphene in accordance with the present disclosure has excellent operating characteristics. Further, appropriate processing conditions for the atomic layer etching process for graphene and successful results of etching were also observed. In addition, it was also proved that damage on the surface of the graphene that might be unintentionally caused in the process of irradiating the energy source can be complemented by performing an annealing process additionally.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

We claim:

1. An atomic layer etching method for graphene, comprising:
   adsorbing reactive radicals on a surface of graphene by exposing the reactive radicals to the surface in a reaction chamber for a predetermined amount of time; and
   irradiating an energy source to the surface of graphene on which the reactive radicals are adsorbed after the predetermined amount of time.

2. The atomic layer etching method of claim 1, wherein the adsorbing reactive radicals and the irradiating the energy source are each performed two or more times.

3. The atomic layer etching method of claim 1, wherein the graphene includes stacked multi-layers of graphene thin films.

4. The atomic layer etching method of claim 3, further comprising:
   adjusting a stacking degree of the stacked multi-layers of graphene thin films.

5. The atomic layer etching method of claim 1, wherein a single layer of graphene thin film included in the graphene is etched by performing the adsorbing reactive radicals and the irradiating the energy source each a single time.

6. The atomic layer etching method of claim 1, wherein the reactive radicals include a reactive radical generated by plasma.

7. The atomic layer etching method of claim 6, wherein the plasma includes a member selected from the group consisting of O-based gas plasma, F-based gas plasma, H-based gas plasma, and combinations thereof.

8. The atomic layer etching method of claim 1, wherein the reactive radicals include a member selected from the group consisting of an O radical, an F radical, an H radical, an $O_2$ radical, an OH radical, an N radical, and combinations thereof.

9. The atomic layer etching method of claim 1, further comprising:
   removing the reactive radicals not adsorbed on the surface of the graphene in the reaction chamber after the adsorbing the step and before the irradiating step.

10. The atomic layer etching method of claim 1, wherein the energy source includes a member selected from the group consisting of a neutral beam, an ion beam, heat energy, plasma, laser, and combinations thereof.

11. The atomic layer etching method of claim 10, wherein the neutral beam contains a non-reactive gas.

12. The atomic layer etching method of claim 10, wherein the neutral beam contains a gas selected from the group consisting of He, Ar, $N_2$, Ne, Xe, and combinations thereof.

13. The atomic layer etching method of claim 1, further comprising:
   removing an etching by-product which is generated by irradiating the energy source.

14. The atomic layer etching method of claim 13, further comprising:
   heating the graphene after removing the etching by-product.

15. The atomic layer etching method of claim 14, wherein the heating includes an annealing process.

16. The atomic layer etching method of claim 1, further comprising:
   depositing an etching mask on the surface of graphene.

17. The atomic layer etching method of claim 1, wherein the adsorption of reactive radicals converts bonds of the graphene from $sp^2$ bonds to $sp^3$ bonds.

18. The atomic layer etching method of claim 3, wherein the step of adsorbing reactive radicals on the surface of the graphene, and the step of irradiating the energy source to the surface on which the reactive radicals are adsorbed, are controlled to thereby selectively remove a single atomic layer portion of the multi-layer graphene surface on which the reactive radicals are adsorbed.

19. The atomic layer etching method of claim 17, wherein the step of irradiating desorbs the $sp^3$ bonded carbon atoms at the surface of the graphene.

20. An atomic layer etching method, comprising:
   adsorbing reactive radicals onto a graphene surface in a reaction chamber for a predetermined amount of time;
   removing from the reaction chamber the reactive radicals not adsorbed on the graphene surface; and
   irradiating the reactive radical-adsorbed graphene surface with an energy source to thereby remove a single atomic layer of the graphene surface.

* * * * *